United States Patent [19]

Miyazaki et al.

[11] Patent Number: 5,760,881
[45] Date of Patent: Jun. 2, 1998

[54] EXPOSURE APPARATUS WITH LIGHT SHIELDING PORTION FOR PLOTOSENSITIVE ELEMENTS

[75] Inventors: Seiji Miyazaki; Kei Nara; Hiroshi Shirasu, all of Yokohama; Tsuyoshi Narabe, Ohmiya, all of Japan

[73] Assignee: Nikon Corporation, Tokyo, Japan

[21] Appl. No.: 540,458

[22] Filed: Oct. 10, 1995

[30] Foreign Application Priority Data

Oct. 13, 1994 [JP] Japan .................... 6-275952

[51] Int. Cl.$^6$ .................... H01L 21/027; G03B 27/72
[52] U.S. Cl. .................... 355/71; 250/548; 355/53; 355/71; 355/77; 378/34
[58] Field of Search .................... 250/548; 356/400, 356/401, 363, 375; 355/53, 77, 71; 378/34; 359/227, 232, 233, 284, 235

[56] References Cited

U.S. PATENT DOCUMENTS

| | | | |
|---|---|---|---|
| 4,613,981 | 9/1986 | Siddall et al. | 378/34 |
| 5,150,391 | 9/1992 | Ebinuma et al. | 348/34 |
| 5,161,176 | 11/1992 | Ebinuma et al. | 348/34 |
| 5,317,615 | 5/1994 | Ebinuma et al. | 378/34 |
| 5,473,410 | 12/1995 | Nishi | 355/53 |
| 5,506,684 | 4/1996 | Ota et al. | 356/401 |

*Primary Examiner*—Arthur T. Grimley
*Assistant Examiner*—Herbert V. Kerner
*Attorney, Agent, or Firm*—Shapiro and Shapiro

[57] ABSTRACT

An exposure apparatus, having an illumination optical system for radiating a light beam from a light source to a pattern area of a mask for transferring the image of the pattern area onto a photosensitive substrate by the light beam passing through the mask, is provided with plural sets of a first reference mark and a second reference mark arranged on the mask and the photosensitive substrate at positions corresponding to each other, and a light-shielding device for shielding the light beams radiated toward the second reference marks, whereby it is possible to re-use the second reference marks in a post-process by preventing the first reference marks on the mask from being superposed on the second reference marks on the photosensitive substrate or from being transferred onto a part near the second reference marks.

11 Claims, 3 Drawing Sheets

5,760,881

1

EXPOSURE APPARATUS WITH LIGHT SHIELDING PORTION FOR PLOTOSENSITIVE ELEMENTS

BACKGROUND OF THE INVENTION

1. Field of the Invention

The present invention relates to an exposure apparatus, and can be applied to an exposure apparatus for manufacturing, for example, a semiconductor device or a liquid crystal display substrate.

2. Related Background Art

Recently, a liquid crystal display substrate has become widely utilized as a display device for a personal computer or an image receiving device or a television set. This liquid crystal display substrate is formed by patterning a transparent thin film electrode into a desired shape on a glass substrate with photoresist applied thereon by photolithography. As an apparatus for this photolithography, a scanning exposure apparatus is used in which an original pattern formed on a mask is projected onto a photoresist layer on a glass substrate through a projection optical system, and at the same time, the mask and the glass substrate are relatively scanned with respect to the projection optical system.

FIG. 3 shows a scanning exposure apparatus 1 of a conventional type. In this exposure apparatus 1, a light beam from an illumination optical system 2 is radiated to a mask 3 so as to project a part of the image of the mask onto a photosensitive substrate 5 through a projection optical system 4. The mask 3 and the photosensitive substrate 5 are integrally held by a carriage 6, and are moved in the x direction in the figure so as to be scanned with respect to the projection optical system 4, whereby the image of the mask is transferred onto the photosensitive substrate 5. A set of first reference marks 7a is provided on the mask 3 and a set of second reference marks 7b is provided on the photosensitive substrate 5. A positional shift between a first reference mark 7a and a corresponding second reference mark 7b is detected by an associated alignment sensor 8 which comprises a photoelectric detector or the like. A scanning exposure is conducted after the mask 3 and the photosensitive substrate 5 are aligned in accordance with the positional shift thus obtained.

In the photolithographic process, positive type resist is usually used. When exposure is effected on a photosensitive substrate with this resist applied thereon, an exposed portion, that is, a resist existing in a portion which has no pattern drawn on the mask, is removed by the development process. On the other hand, as for a negative type resist which has opposite properties to the positive type resist, a portion which is not exposed, that is, a resist existing in a portion which has the pattern drawn on the mask is removed by the developing process.

A second reference mark 7b is formed by transferring a first reference mark 7a on the mask onto the resist on the photosensitive substrate 5 by the exposure together with the pattern on the same mask 3. For this reason, when the second reference mark 7b is exposed in the next step in a superposing manner on the pattern which has been formed in advance, the first reference mark 7a for alignment is projected in a superposing manner onto the second reference mark which has been formed in advance. Accordingly, the positive type resist has a problem that the second reference mark 7b which has been formed in advance is removed (disappears) by the developing process. The negative type resist, on the other hand, has a problem that the mark is formed in a superposing manner on the mark 7b which has

2 been formed in advance so that an alignment accuracy of the mask and the photosensitive substrate is degraded in the subsequent steps by the developing process. Furthermore, the second reference mark which is once used for alignment can not be re-used for alignment in the post-process, which results in a substantial limitation on a mask designing, a layout of a circuit pattern to be exposed, or the like.

In order to prevent the disappearance or redundancy of a mark as mentioned above, it can be conceived to form a mark in the second or subsequent exposure operations at a different position from that of a mark previously formed. In this case, however, when the alignment is conducted for the second time in the exposure apparatus after a series of steps of development, film formation, resist application, etc., on the photosensitive substrate 5, there are present plural kinds of reference marks on the photosensitive substrate 5 and, accordingly, plural pieces of positional information can be obtained. For this reason, a rate of or an accuracy in detection of a positional shift between the mask 3 and the photosensitive substrate 5 is degraded.

SUMMARY OF THE INVENTION

The present invention has been made taking above-mentioned circumstances into consideration, and an object of the present invention is to provide an exposure apparatus which can re-use a second reference mark in a post-process by preventing a first reference mark on a mask from being superposed on a second reference mark on a photosensitive substrate or being transferred onto a part near the second reference mark.

In order to solve the above-described problems, according to the present invention, in an exposure apparatus having an illumination optical system for radiating a light beam from a light source to a pattern area of a mask so as to transfer the image of the pattern area onto a photosensitive substrate by use of the light beam passing through the mask, there are provided plural sets of a first reference mark and a second reference mark arranged on the mask and the photosensitive substrate, respectively, at positions corresponding to each other, and light-shielding means for shielding the portion of the light beam directed to the second reference mark.

For this reason, according to the present invention, it is possible to prevent the first reference mark from being transferred onto the vicinity of the second reference mark which has been formed in advance, in particular by using the light-shielding means for shielding the light beam directed to the second reference mark. Furthermore, since the second reference mark on the photosensitive substrate used in the previous exposure step can be re-used for positioning the mask and the photosensitive substrate in the subsequent steps, the pattern on the mask can be transferred onto an existing pattern on the photosensitive substrate with a high accuracy without a change in the positional relationship of the reference marks.

DESCRIPTION OF THE PREFERRED EMBODIMENTS

Figure 1:
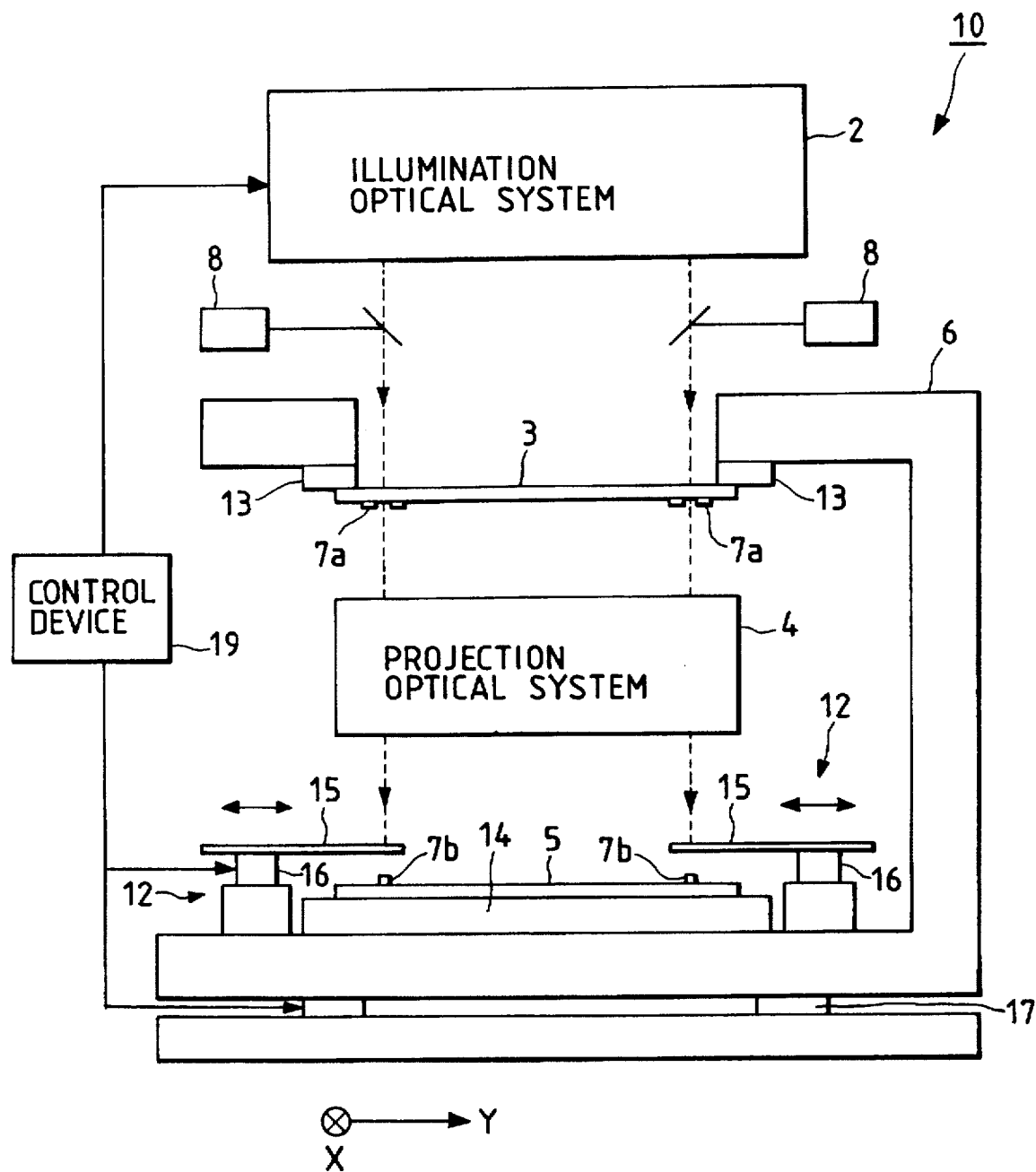
FIG. 1 is a view showing a schematic structure of an exposure apparatus according to an embodiment of the present invention.
Figure 3:
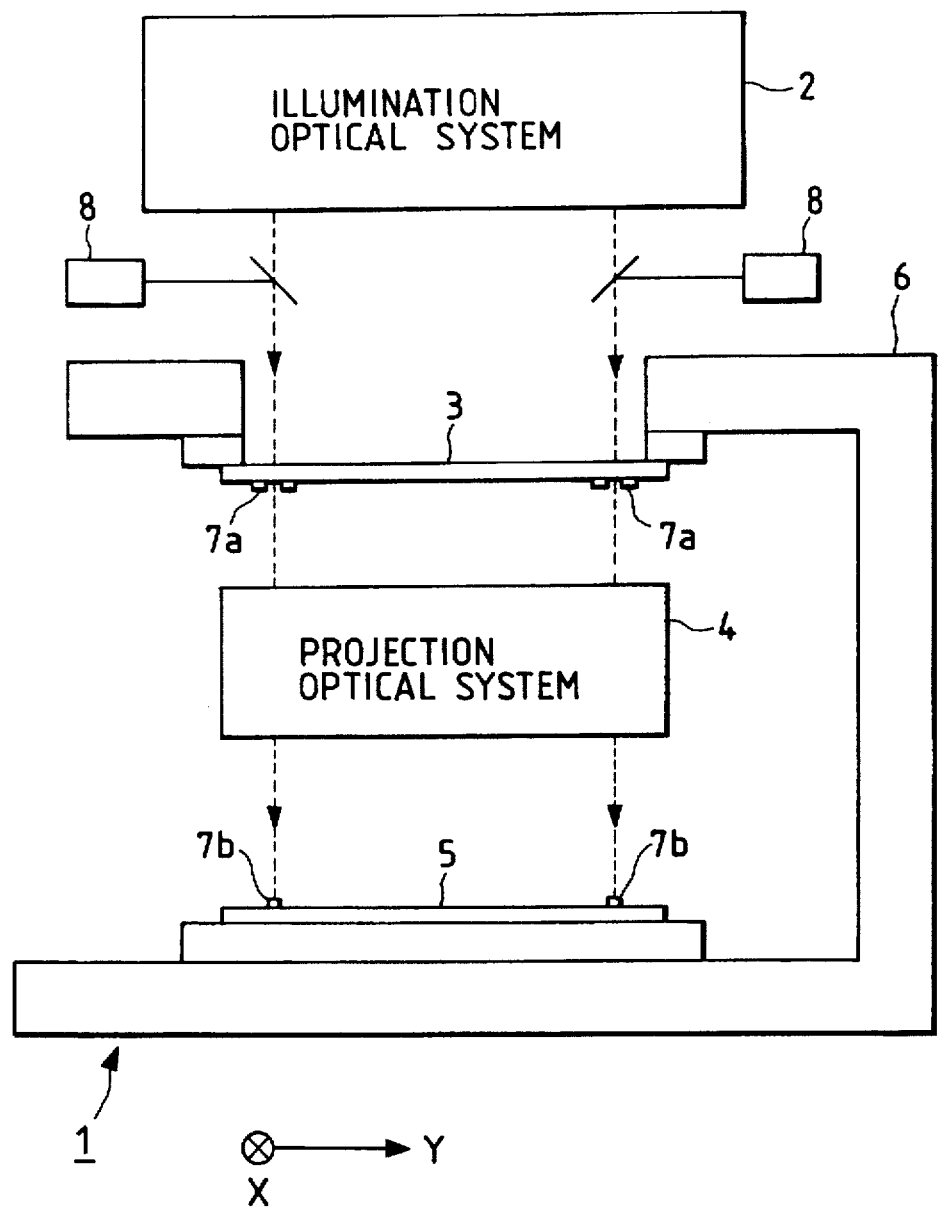
FIG. 3 is a view showing a schematic structure of a conventional exposure apparatus.

In FIG. 1 in which the same reference numerals as those in FIG. 3 are given, reference numeral 10 denotes an exposure apparatus of a scanning type as a whole. The exposure apparatus 10 is comprised of an illumination optical system 2 for radiating a light beam onto a mask 3, a projection optical system 4 for projecting the image of a pattern area on the mask 3 onto a photosensitive substrate 5 such as a glass substrate, a carriage 6 for integrally holding the mask 3 and the photosensitive substrate 5 through holders 13 and 14, and a light-shielding mechanism 12 for shielding a part of the light beam radiated from the illumination optical system 2. This exposure apparatus 10 transfers the pattern on the mask 3 onto the photosensitive substrate 5 by scanning the mask 3 and the photosensitive substrate 5 in synchronism with respect to the projection optical system 4 in the x direction in the figure.

The light beam radiated from the illumination optical system 2 illuminates the mask 3 which is vacuum-chucked by the mask holder 13 on the carriage 6. The pattern on the mask 3 is imaged on the photosensitive substrate 5, which is vacuum-chucked by the photosensitive substrate holder 14 on the carriage, through the projection optical system 4. The carriage 6 has a scanning mechanism 17 which is comprised of an air guide for effecting scanning in the x direction in the figure between the illumination optical system 2 and the projection optical system 4 while keeping the relative positional relationship between the mask 3 and the photosensitive substrate 5, a linear motor, and the like. The carriage 6 transfers the pattern on the mask 3 with a uniform exposure amount onto the photosensitive substrate 5. A first reference mark 7a for aligning the mask 3 and the photosensitive substrate 5 is formed at each of the four corners of the pattern area on the mask 3. A respective second reference mark 7b is formed at the position corresponding to each first reference mark on the photosensitive substrate 5. The second reference mark 7b is formed by transferring previously (at the exposure time in the pre-process) the first reference mark 7a formed on the other mask onto a resist together with a transfer of the pattern.

The light-shielding mechanisms 12 are provided in the vicinity of the photosensitive substrate 5 on the carriage 6 corresponding to the positions at which four sets of the reference marks are respectively disposed. Each of these light-shielding mechanisms 12 has a light-shielding plate 15 in a space between the photosensitive substrate 5 and the projection optical system 4 so as to shield light beams directed toward the second reference marks. This light-shielding plate 15 is slid or rotatingly moved by a driving device 16 such as a motor, an electromagnetic valve, or the like, as indicated by the arrow in the figure, and is arranged to be movable forward and backward with respect to the light beams.

With the above-mentioned structure, when the alignment between the mask 3 and the photosensitive substrate 5 is conducted prior to the exposure, a control device 19 slides or rotates the light-shielding plate 15 of the light-shielding mechanism 12 so as to retract them from light beams from the illumination optical system. On this occasion, the light beams from the illumination optical system 2 (the light beams having a wavelength different from that of the exposure light beam, or the light beams of energy which is much smaller than the necessary energy for the exposure) illuminate the mask 3, and project the image of the first reference mark 7a onto the photosensitive substrate 5 via the projection optical system 4. In this case, a positional shift between the first reference mark and the second reference mark is detected by a well-known alignment sensor 8 so as to align the mask 3 and the photosensitive substrate 5 based on a result of this detection.

Next, when the exposure is conducted, the light-shielding plate 15 is slid or rotated to be inserted into light beams between the projection optical system 4 and the photosensitive substrate 5. After that, the light beams from the illumination optical system 2 are radiated onto a pattern area on the mask 3, and the pattern image is projected onto the photosensitive substrate 5 through the projection optical system 4. In this case, since the light-shielding plate 15 is present between the projection optical system 4 and the photosensitive substrate 5, the image of the first reference mark 7a is shielded by the light-shielding plate 15 so that only the pattern on the mask 3 is projected on the photosensitive substrate 5.

With the above-mentioned structure, the light-shielding mechanism 12 having the light-shielding plate 15 which is slid or rotatingly moved is disposed on the carriage 6, and the light-shielding plate 15 is inserted into the light beams from the illumination optical system 2 when a scanning exposure is conducted, whereby the projected image of the first reference mark 7a is prevented from being transferred onto the photosensitive substrate 5 and only the pattern on the mask is transferred on the photosensitive substrate 5. For this reason, when another mask pattern is to be transferred onto the photosensitive substrate 5, the alignment can be conducted by using the second reference mark 7b which has been formed on the photosensitive substrate 5 previously.

In the foregoing embodiment, an apparatus using the four light-shielding mechanisms 12 corresponding to the first reference marks 7a and the second reference marks 7b is described. However, the present invention is not limited to this. It is also possible to arrange light-shielding mechanisms to the number determined by the layout of the first reference marks and the second reference marks.

Also, in the foregoing embodiment, an apparatus using the light-shielding mechanism 12 provided on the carriage 6 on the photosensitive side and having the light-shielding plate 15 to be inserted into a space between the projection optical system 4 and the photosensitive substrate 5 is described. However, the present invention is not limited to this. It is also possible to arrange a light-shielding portion on the carriage 6 on the mask 3 side so that the light-shielding plate 15 can be inserted into light beams between the mask 3 and the illumination optical system 2 or between the mask 3 and the projection optical system 4.

Figure 2:
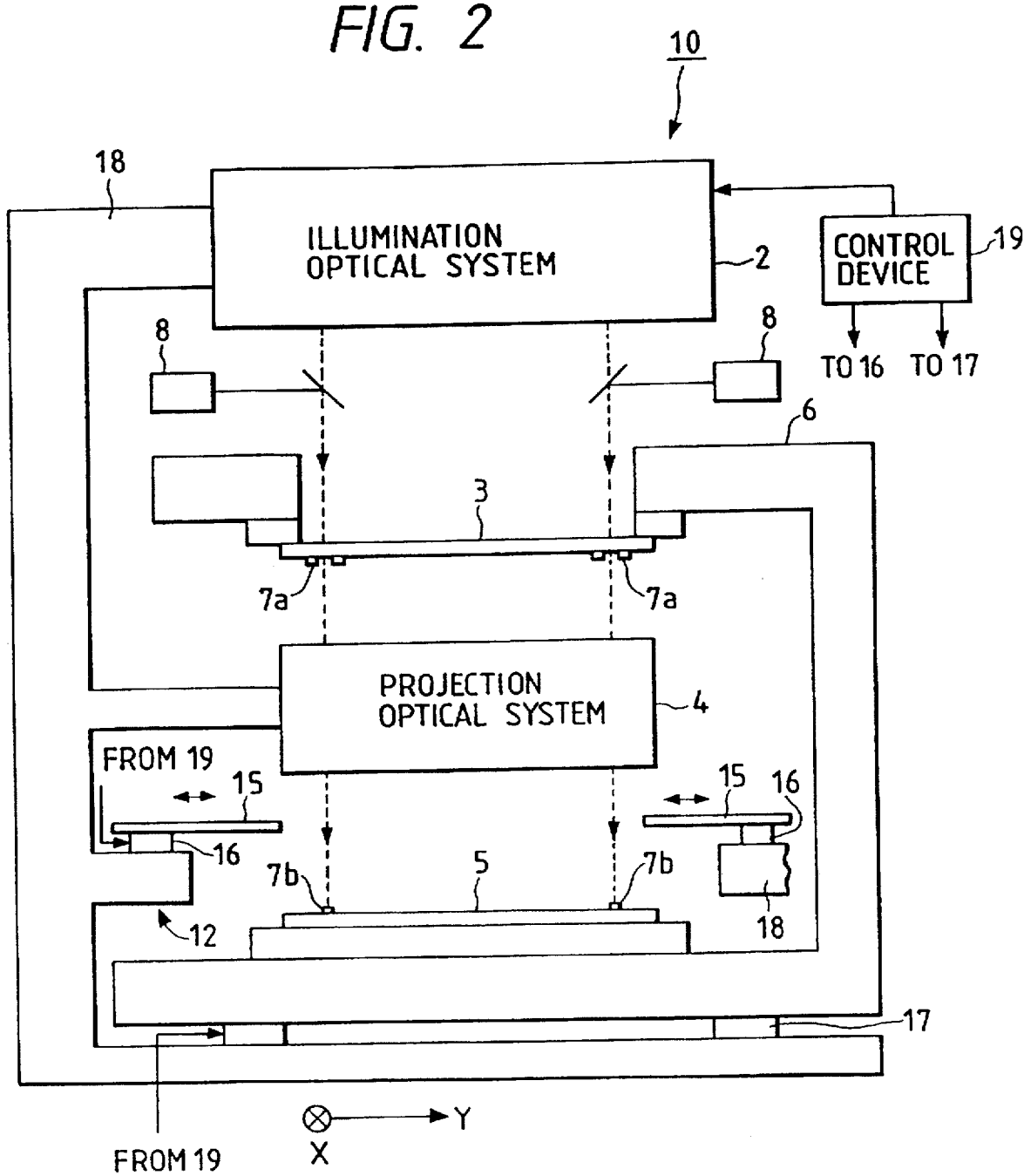
FIG. 2 is a view showing a schematic structure of an exposure apparatus according to another embodiment of the present invention.

Furthermore, in the foregoing embodiment, the light-shielding mechanism 12 is disposed on the carriage 6. However, the present invention is not limited to such arrangement. The light-shielding mechanism 12 may be arranged to be driven on the carriage 6 in a scanning direction or in a direction perpendicular to the scanning direction so as to be controlled to shield light at an arbitrary position by use of the control device 19. Also, as shown in FIG. 2, the light-shielding mechanism may be arranged on a stand 18 for supporting the illumination optical system or the projection optical system and may be controlled by the control device 19 to draw out the light-shielding plate 15 in synchronism with the position of the moving carriage. In this case, this arrangement can be adopted regardless of structural limitations of the apparatus on a pattern layout, a space between the mask or the photosensitive substrate and the projection optical system, or the like.

Also, though the exposure apparatus of the scanning type is described in the foregoing embodiments, the present invention is not limited to this, and can be applied also to an exposure apparatus of a step-and-repeat scheme or a proximity exposure apparatus.

What is claimed is:

1. An exposure apparatus, comprising:

a mask stage for holding a mask provided with a plurality of first reference marks;

a substrate stage for holding a photosensitive substrate provided with a plurality of second reference marks at positions corresponding to positions of said plurality of first reference marks;

a movable carriage for integrally holding said mask stage and said substrate stage;

an illumination optical system for radiating exposure light, having a wavelength for exposing said photosensitive substrates onto the mask; and a light-shielding device disposed on said carriage for shielding exposure light directed to said second reference marks from the illumination optical system.

2. An exposure apparatus according to claim 1, wherein said light-shielding device includes a plurality of light-shielding members corresponding to said second reference marks and which are positionable to shield exposure light when the image of said mask is transferred onto said photosensitive substrate.

3. An exposure apparatus according to claim 1, further comprising:

a driving mechanism for driving a light-shielding portion of said light-shielding device between a shielding position at which exposure light is shielded and a non-shielding position at which exposure light is not shielded; and a control device for controlling said driving mechanism so as to drive said light-shielding portion to said light-shielding position when the image of said mask is transferred onto said photosensitive substrate, thereby shielding exposure light directed to said second reference marks.

4. An exposure apparatus according to claim 3, further comprising:

a scanning mechanism for scanning said mask and said photosensitive substrate in synchronism with respect to said exposure light, wherein said control device controls said driving mechanism so that said light-shielding portion is disposed at said light-shielding position when said photosensitive substrate is moved to a position at which exposure light would be radiated onto said second reference marks in said scanning operation.

5. An exposure apparatus according to claim 4, further comprising:

a position detector for detecting corresponding first and second reference marks at the same time, wherein said control device controls said driving mechanism such that said light-shielding portion is disposed at said non-shielding position when said mask and said photosensitive substrate are positioned in order to detect said marks by use of said position detector.

6. An exposure apparatus according to claim 1, further comprising a projection optical system for projecting an image of said mask to said photosensitive substrate, and said light-shielding device is disposed between said projection optical system and said photosensitive substrate.

7. An exposure apparatus according to claim 1, wherein said photosensitive substrate is a glass substrate.

8. An exposure apparatus, comprising:

a mask stage for holding a mask provided with a plurality of first reference marks;

a substrate stage for holding a photosensitive substrate provided with a plurality of second reference marks at positions corresponding to positions of said plurality of first reference marks;

a driving mechanism for integrally holding said mask stage and said substrate stage and for moving in a predetermined direction;

an illumination optical system for radiating exposure light, having a wavelength for exposing said photosensitive substrate, onto the mask;

a projection optical system for projecting an image of said mask onto said photosensitive substrate;

a holding member for holding at least one of said illumination optical system and said projection optical system; and a light-shielding device disposed on said holding member and including a light-shielding portion for shielding exposure light directed to said second reference marks from said illumination optical system.

9. An exposure apparatus according to claim 8, wherein said light-shielding portion is disposed between said projection optical system and said photosensitive substrate.

10. An exposure apparatus according to claim 8, further comprising a control device for controlling said light-shielding device in synchronism with the movement of said driving mechanism.

11. An exposure apparatus according to claim 8, wherein said photosensitive substrate is a glass substrate.

* * * * *